(12) United States Patent
Himori et al.

(10) Patent No.: US 7,622,017 B2
(45) Date of Patent: Nov. 24, 2009

(54) PROCESSING APPARATUS AND GAS DISCHARGE SUPPRESSING MEMBER

(75) Inventors: Shinji Himori, Nirasaki (JP); Shosuke Endoh, Nirasaki (JP); Kazuya Nagaseki, Nirasaki (JP); Tomoya Kubota, Nirasaki (JP); Daisuke Hayashi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 190 days.

(21) Appl. No.: 10/856,797

(22) Filed: Jun. 1, 2004

(65) Prior Publication Data

US 2005/0011456 A1 Jan. 20, 2005

Related U.S. Application Data

(63) Continuation of application No. PCT/JP02/12349, filed on Nov. 27, 2002.

(30) Foreign Application Priority Data

Nov. 30, 2001 (JP) .............................. 2001-366370

(51) Int. Cl.
*C23C 16/509* (2006.01)
*C23C 16/52* (2006.01)
*C23F 1/00* (2006.01)
*H01L 21/306* (2006.01)

(52) U.S. Cl. ............................. 156/345.43; 118/723 E; 118/666; 118/663; 118/728; 156/345.27; 156/345.24

(58) Field of Classification Search ............. 118/723 E, 118/723 ER, 666, 663, 728; 156/345.43–345.48, 156/345.27, 345.24
See application file for complete search history.

(56) References Cited

U.S. PATENT DOCUMENTS 4,565,601 A * 1/1986 Kakehi et al. ............... 216/59
4,771,730 A * 9/1988 Tezuka .................... 118/723 E
5,177,878 A * 1/1993 Visser ........................ 34/92

(Continued)

FOREIGN PATENT DOCUMENTS

JP 63-102319 5/1988

(Continued)

OTHER PUBLICATIONS http://www.matweb.com/search/SpecificMaterial.asp?bassnum=BQUARTZ.*

*Primary Examiner*—Rudy Zervigon
(74) *Attorney, Agent, or Firm*—Oblon, Spivak, McClelland, Maier & Neustadt, L.L.P.

(57) ABSTRACT

A processing apparatus for performing a process on a surface of an object to be processed by applying a high frequency power to an electrode installed in an airtight processing chamber to convert a processing gas introduced therein into a plasma, includes a thermal transfer gas feed pathway for supplying a thermal transfer gas for controlling a temperature of the object to be processed to a minute space between the object to be processed and a holding unit installed on the electrode for attracting and holding the object to be processed through an inner portion of an insulating member disposed under the electrode. A portion of the thermal transfer gas feed pathway, which passes through the inner portion of the insulating member, is formed in a zigzag shape or a spiral shape with respect to a normal direction of a holding surface of the holding unit.

22 Claims, 16 Drawing Sheets

U.S. PATENT DOCUMENTS

| | | | |
|---|---|---|---|
| 5,194,118 A | | 3/1993 | Shinohara .................... 216/79 |
| 5,255,153 A | * | 10/1993 | Nozawa et al. .............. 361/234 |
| 5,376,213 A | * | 12/1994 | Ueda et al. ............. 156/345.27 |
| 5,382,311 A | * | 1/1995 | Ishikawa et al. ....... 156/345.54 |
| 5,529,657 A | * | 6/1996 | Ishii ...................... 156/345.26 |
| 5,542,559 A | | 8/1996 | Kawakami et al. ............ 216/67 |
| 5,547,539 A | * | 8/1996 | Arasawa et al. ............. 438/715 |
| 5,622,593 A | * | 4/1997 | Arasawa et al. ........ 156/345.27 |
| 5,625,526 A | * | 4/1997 | Watanabe et al. ........... 361/234 |
| 5,698,062 A | * | 12/1997 | Sakamoto et al. ...... 156/345.44 |
| 5,775,416 A | * | 7/1998 | Heimanson et al. ......... 165/275 |
| 5,835,334 A | * | 11/1998 | McMillin et al. ............ 361/234 |
| RE36,810 E | * | 8/2000 | Arasawa et al. ........ 156/345.27 |
| 6,106,737 A | * | 8/2000 | Tomoyasu et al. ............ 216/67 |
| 6,780,278 B2 | * | 8/2004 | Hayashi et al. ........ 156/345.47 |

FOREIGN PATENT DOCUMENTS

| | | |
|---|---|---|
| JP | 04-233728 | 8/1992 |
| JP | 06-244119 | 9/1994 |

\* cited by examiner

PROCESSING APPARATUS AND GAS DISCHARGE SUPPRESSING MEMBER

This application is a Continuation Application of PCT International Application No. PCT/JP02/12349 filed on Nov. 27, 2002, which designated the United States and which is incorporated by reference herein.

FIELD OF THE INVENTION

The present invention relates to a processing apparatus; and, more particularly, to a processing apparatus and a gas discharge suppressing member capable of preventing a thermal transfer gas from discharging in a thermal transfer gas feed pipe which serves to supply the thermal transfer gas for temperature control to a bottom surface of an object to be processed.

BACKGROUND OF THE INVENTION

There has been used in semiconductor manufacturing processes a processing apparatus for performing a process on a surface of an object to be processed while controlling a temperature thereof in an airtight processing chamber. FIG. 20 is a schematic cross sectional view showing an inside of a processing chamber of a conventional processing apparatus; and FIG. 21 is a schematic perspective view of a block for thermal transfer gas feed pipe.

As shown in FIG. 20, provided inside the processing chamber of the conventional processing apparatus is a lower electrode 10 also serving as a mounting table for mounting thereon an object to be processed, i.e., a semiconductor wafer W. An electrostatic chuck 12 for attracting and holding the semiconductor wafer W is installed on top of the lower electrode 10. A bottom portion of the lower electrode 10 is coupled with a grounded member 7 (e.g., an outer wall of the processing chamber) via an insulator 4.

There is provided between the electrostatic chuck 12 and the semiconductor wafer W a minute space (not shown) to which a thermal transfer gas for controlling the semiconductor wafer W to a specified temperature can be supplied, and the thermal transfer gas, e.g., a He gas, is supplied from a thermal transfer gas pressure control unit 68.

During a process, a high frequency power is applied to the lower electrode 10 and a plasma 50 is produced above the semiconductor wafer W. Meanwhile, e.g., a voltage V, which is identical to that generated between the lower electrode 10 and the plasma, is generated between the lower electrode 10 and the member 7 by the high frequency power.

Discharge may occur due to such voltage V, which induces electrons in the thermal transfer gas to accelerate in a thermal transfer gas feed pipe. Thus, in order to prevent such occurrence of discharge or the like, a block unit 64 for thermal transfer gas feed pipe is inserted in a portion of the thermal transfer gas feed pipe, wherein the thermal transfer gas is supplied via a thermal transfer gas feed pipe 60, the block unit 64 for thermal transfer gas feed pipe, and a thermal transfer gas feed pipe 62.

As shown in FIG. 21, the conventional block unit 64 for thermal transfer gas feed pipe is made of resin, e.g., Teflon (a registered trademark), and includes, e.g., three blocks 64-1, 64-2 and 64-3 for thermal transfer gas feed pipe having alternately formed holes. Resultantly, the voltage V is divided by as many as the number of the blocks for thermal transfer gas feed pipe. Further, every time the thermal transfer gas reaches an end portion of each block for thermal transfer gas feed pipe, the thermal transfer gas collides therewith to change the proceeding direction thereof and the energy of the accelerated electrons becomes lowered, which in turn prevents the discharge.

However, in a recent trend of high integration of semiconductor devices, there is a need for a processing under a condition of a higher voltage V. When a high voltage is applied in the conventional blocks 64-1, 64-2 and 64-3 for thermal transfer gas feed pipe, the thermal transfer gas may easily be discharged because the number of holes is large and further the thermal transfer gas is supplied in a substantially linear path.

In an effort to overcome such drawbacks, a greater number of blocks for thermal transfer gas feed pipe have been employed in the block unit 64 for thermal transfer gas feed pipe. However, as the number of blocks for thermal transfer gas feed pipe is increased, the pressure difference between a bottom surface of the semiconductor wafer W and a thermal transfer gas pressure control unit 68 increases, which deteriorates the responsiveness of the thermal transfer gas and as a result may render inaccurate control of the temperature of the object to be processed. Further, the conventional block for thermal transfer gas feed pipe is generally made of resin, e.g., Teflon, which may melt in a case of an occurrence of discharge.

The present invention has been conceived from the above drawbacks of the conventional processing apparatus; and it is, therefore, an object of the present invention to provide a novel, improved processing apparatus and a gas discharge suppressing member for use therein, capable of preventing the discharge of the thermal transfer gas and accurately controlling the temperature of the object to be processed.

SUMMARY OF THE INVENTION

In accordance with one aspect of the present invention in order to overcome the above drawbacks, there is provided a processing apparatus for performing a process on a surface of an object to be processed by applying a high frequency power to an electrode installed in an airtight processing chamber to convert a processing gas introduced therein into a plasma, including a thermal transfer gas feed pathway for supplying a thermal transfer gas for controlling a temperature of the object to be processed to a minute space between the object to be processed and a holding unit for attracting and holding the object to be processed, wherein at least a portion of the thermal transfer gas feed pathway is inclined with respect to a normal direction of a holding surface of the holding unit.

At least the portion of the thermal transfer gas feed pathway may be substantially inclined with respect to the normal direction of the holding surface of the holding unit by a member installed in the thermal transfer gas feed pathway. The member may be formed of a porous ceramic. The thermal transfer gas feed pathway may be formed in a zigzag shape or a spiral shape. A cross sectional thickness of the thermal transfer gas feed pathway in a direction of electric field may be smaller than a width thereof and, further, equal to or less than 1 mm. The thermal transfer gas feed pathway may be formed in a member having a dielectric constant equal to or less than 4 and may be formed of a plurality of paths.

By such configuration, a distance of the thermal transfer gas feed pathway in the direction of electric field is shortened and thus energy of the electrons in the thermal transfer gas is decreased by collision against the side wall or the like of the thermal transfer gas feed pathway, which in turn prevents discharge without fail. Further, in case of using a member for inclining the substantial feed pathway of the thermal transfer gas with respect to the direction of electric field is a porous ceramic, the pressure of the thermal transfer gas can be controlled readily and the temperature of the object to be processed can be accurately controlled even without employing a large of members. Furthermore, the porous ceramic has excellent voltage resistance and heat resistance compared with a resin and thus is not easily melted in the event of occurrence of discharge in other parts. A thickness of the thermal transfer gas feed pathway in the direction of electric field is made smaller than a width thereof and thus an electric field space becomes narrower. Thus acceleration of the electrons in the thermal transfer gas can be suppressed by the wall and discharge can be prevented. Still further, the thickness in the direction of electric field is made equal to or less than 1 mm, which in turn prevents discharge and improves gas flow rate and manufacturability as well.

The thermal transfer gas feed pathway may be formed inside a member having a dielectric constant equal to or less than 4. For example, the member may be formed of quartz or a fluorine resin such as Teflon (a registered trademark), polytetrafluoroethylene (PTFE), polychlorotrifluoroethylene (PCTFE), tetrafluoroethylene-perfluoroalkyl-vinyl ether copolymer resin (PFA), tetrafluoroethylene-hexafluoropropylene copolymer resin (PFEP), and polyvinylidenefluoride resin (PVDF). Accordingly, a voltage applied to the thermal transfer gas feed pathway becomes lower and thus the thickness of the thermal transfer gas feed pathway can be made larger. Therefore, discharge can be prevented and gas flow rate and manufacturability can be improved as well.

Additionally, a processing apparatus for performing a process on a surface of an object to be processed by applying a high frequency power to an electrode installed in an airtight processing chamber to convert a processing gas introduced therein into a plasma may include a thermal transfer gas feed pathway for supplying a thermal transfer gas for controlling a temperature of the object to be processed to a minute space between the object to be processed and a holding unit for attracting and holding the object to be processed, wherein there are alternately disposed along the thermal transfer gas feed pathway at least one approximately cylindrical first member with the thermal transfer gas feed pathway provided at a peripheral portion thereof and at least one approximately cylindrical second member with the thermal transfer gas feed pathway provided at a central portion thereof.

By such configuration, when the thermal transfer gas reaches the approximately cylindrical first member, a proceeding direction thereof is changed almost perpendicularly by collision and then the thermal transfer gas proceeds through paths of the peripheral portion until reaching the second member. Thereafter, the proceeding direction thereof is changed almost perpendicularly again and the thermal transfer gas proceeds through a path of the central portion of the first member. Accordingly, the thermal transfer gas is sure to proceed by a certain distance in a direction perpendicular to electric field and thus the energy of the electrons in the thermal transfer gas can be surely decreased by collision against a bottom portion of the first or the second member, which in turn prevents discharge.

Further, a large number of members for inclining the substantial feed pathway of the thermal transfer gas with respect to the direction of electric field need not be used, there can be provided a processing apparatus capable of readily controlling the pressure of the thermal transfer gas and accurately controlling the temperature of the object to be processed.

In accordance with another aspect of the present invention in order to overcome the above drawbacks, there is provided a gas discharge suppressing member installed in a thermal transfer gas feed pathway for supplying a thermal transfer gas for controlling a temperature of an object to be processed to a minute space between the object to be processed and a holding unit for attracting and holding the object to be processed in an airtight processing chamber, the gas discharge suppressing member having a portion of the thermal transfer gas feed pathway, wherein the feed pathway in the gas discharge suppressing member is formed in a spiral shape. Further, a cross sectional thickness of the feed pathway in the gas discharge suppressing member along a direction of electric field may be smaller than a width thereof. Furthermore, the cross sectional thickness of the feed pathway in the gas discharge suppressing member in the direction of electric field may be equal to or less than 1 mm, and the gas discharge suppressing member may be formed of a material having a dielectric constant equal to or less than 4.

Such configuration shortens a distance of the thermal transfer gas feed pathway in the direction of electric field and decreases the energy of the electrons in the thermal transfer gas by collision against the side wall or the like of the thermal transfer gas feed pathway, so that discharge can be surely prevented. Further, in case of a member for inclining the substantial feed pathway of the thermal transfer gas with respect to the direction of electric field is a porous ceramic, the pressure of the thermal transfer gas can be readily controlled and the temperature of the object to be processed can be accurately controlled without a large number of members. Furthermore, the porous ceramic has excellent voltage resistance and heat resistance compared with a resin and thus is not easily melted in the event of occurrence of discharge in other parts. A thickness of the thermal transfer gas feed pathway in the direction of electric field is made smaller than a width thereof and thus an electric field space becomes narrower. Thus acceleration of the electrons in the thermal transfer gas can be suppressed by the wall and discharge can be prevented. Still further, the thickness in the direction of electric field is made equal to or less than 1 mm, which in turn prevents discharge and improves gas flow rate and manufacturability as well.

Moreover, the gas discharge suppressing member may be provided with a connecting member formed therein a thermal transfer gas passageway at either or each of an inlet side and an outlet side of the thermal transfer gas, wherein at least a portion of the thermal transfer gas passageway is inclined with respect to a normal direction of a holding surface of the holding unit. By using this, the space at the boundary between the gas discharge suppressing member and the conductive member at an inlet side or the lower electrode at an outlet side, at which contour lines of electric potential protrudes, can be minimized and acceleration of electrons can be prevented as well. Consequently, discharge (particularly, spark discharge) can be prevented at the boundary region.

DETAILED DESCRIPTION OF THE PREFERRED EMBODIMENTS

Figure 1:
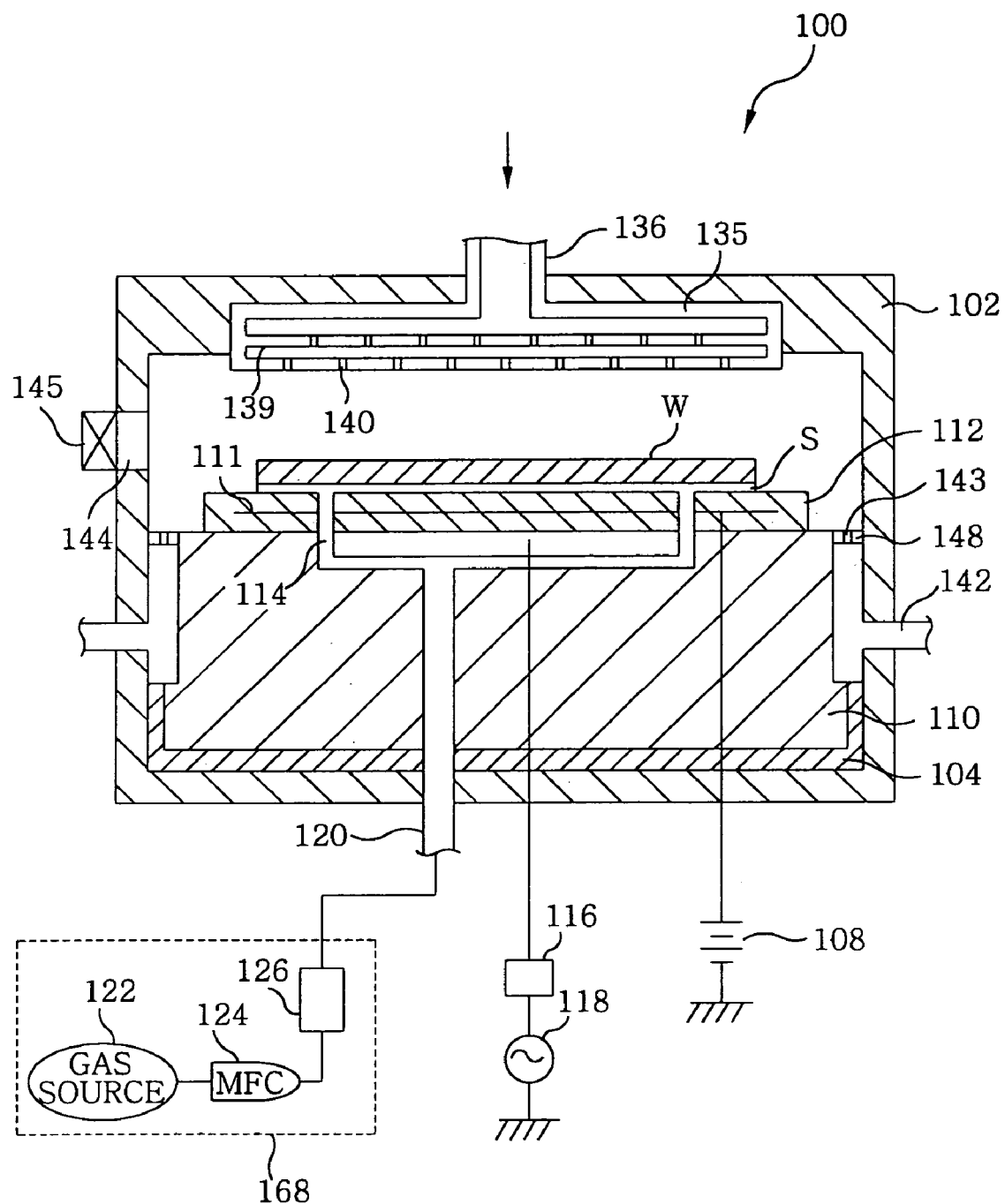
FIG. 1 shows a schematic cross sectional view of a plasma etching device 100.

Hereinafter, preferred embodiments of a processing apparatus in accordance with the present invention will be described in detail with reference to accompanying drawings, in which like reference numerals designate like parts having practically the same functions throughout the specification and the drawings and are omitted to avoid repeated description thereof.

Embodiment 1

FIG. 1 is a schematic cross sectional view of a plasma etching device 100 in accordance with a first embodiment. As shown in FIG. 1, the plasma etching device 100 includes a cylindrical or rectangular processing chamber 102 formed of, e.g., aluminum. A lower electrode 110 also serving as an approximately cylindrical mounting table for mounting thereon an object to be processed, e.g., a semiconductor wafer W, is installed on a bottom portion of the processing chamber 102 via an insulating member 104 such as quartz or ceramic.

The lower electrode 110 may be formed by assembling a plurality of members formed of, e.g., aluminum, by using bolts and the like; and a cooling unit (not shown) and heating unit (not shown) for controlling the temperature of the object to be processed to a specified temperature may be installed inside the lower electrode 110.

An electrostatic chuck 112 serving as a holding unit for holding the semiconductor wafer W is installed on a top surface of the lower electrode 110. The electrostatic chuck 112 is installed to have approximately the same shape and size as the semiconductor wafer W, preferably, with a slightly smaller diameter than the semiconductor wafer W. The electrostatic chuck 112 is formed of a polymer insulating film such as polyimide resin, having a conductive film 111 such as a copper foil embedded therein. The conductive film 111 is connected to a high voltage DC power supply 108 and by applying the high voltage thereto, the semiconductor wafer W is attracted and held thereby. Further, a mechanical chuck for mechanically holding the semiconductor wafer W may be used in lieu of the electrostatic chuck 112.

The electrostatic chuck 112 has a plurality of thermal transfer gas feed holes 114. A thermal transfer gas feed unit 120 is connected to the thermal transfer gas feed holes 114, to which a thermal transfer gas, e.g., an inert gas such as a He gas, is supplied from a thermal transfer gas pressure control unit 168, which includes a gas source 122, a mass flow controller 124, and a temperature control unit 126.

In addition to the inert gas such as He, an $SF_6$ gas is preferable as the thermal transfer gas. Further, it is possible to use the same species of gas as a processing gas, e.g., a $CHF_3$ gas or a gaseous mixture containing a $CHF_3$ gas and a CO gas. The mass flow controller 124 and the temperature control unit 126 control the thermal transfer gas to have desired flow and temperature, respectively.

It is feasible to increase efficiency of heat transfer from the lower electrode 110 to the semiconductor wafer W by supplying the thermal transfer gas from the thermal transfer gas pressure control unit 168 to a minute space S above the electrostatic chuck 112 via the thermal transfer gas feed unit 120. The structure of the thermal transfer gas feed unit 120 will be described afterwards.

A high frequency power supply 118 is connected to the lower electrode 110 via a matching unit 116. In processing the object to be processed, a high frequency power of, e.g., 13.56 MHz, is applied to the lower electrode 110 by the high frequency power supply 118. Disposed to face the lower electrode 110 is an upper electrode 135 at a distance of about 10 to 20 mm thereabove. The upper electrode 135 is hollow and has a multiplicity of holes 140 for introducing therethrough the processing gas supplied from a gas feed pipe 136 into the processing chamber 102.

A port 144 for loading an object to be processed is formed on a sidewall of the processing chamber 102. The object to be processed is loaded or unloaded through the object loading port 144 via an automatically opening and closing gate valve 145. An exhaust port 142 connected to an exhaust unit (not shown), e.g., a vacuum pump, is formed at a lower portion of the processing chamber 102, through which evacuation thereof is performed, whereby the inside of the processing chamber is maintained at a specified vacuum level.

A baffle plate 148 having plural baffle holes 143 is interposed between the processing chamber 102 and the lower electrode 110 in such a manner to surround the lower electrode 110. The baffle plate 148 regulates the flow of exhaust stream in order to uniformly pump the processing gas and the like out of the processing chamber.

Next, a processing operation using the plasma etching device 100 is described. When the object to be processed, i.e., the semiconductor wafer W, is loaded into the processing chamber 102 from the object loading port 144, high voltage is applied to the electrostatic chuck 112 from the high voltage DC power supply 108 and consequently the lower electrode 110 attracts and holds the semiconductor wafer W. Subsequently, the thermal transfer gas regulated at a predetermined temperature and flow rate is supplied into the minute space S from the thermal transfer gas pressure control unit 168 through the thermal transfer gas feed unit 120 to regulate the semiconductor wafer W at a specified temperature.

Thereafter, the processing gas such as a gaseous mixture including, e.g., $CHF_3$ gas is introduced from the gas feed pipe 136 and exhausted through the exhaust port 142, and thereby maintaining the processing chamber at a specified vacuum level. When a power of, e.g., 13.56 MHz, is supplied to the lower electrode 110 from the high frequency power supply 118 via the matching unit 116, a plasma is formed above the semiconductor wafer W and an etching process is performed on the semiconductor wafer W. Upon completion of the process, supply of the powers from the high voltage DC power supply 108 and the high frequency power supply 118 is stopped and the semiconductor wafer W is unloaded through the port 144 for loading an object to be processed.

Figure 2:
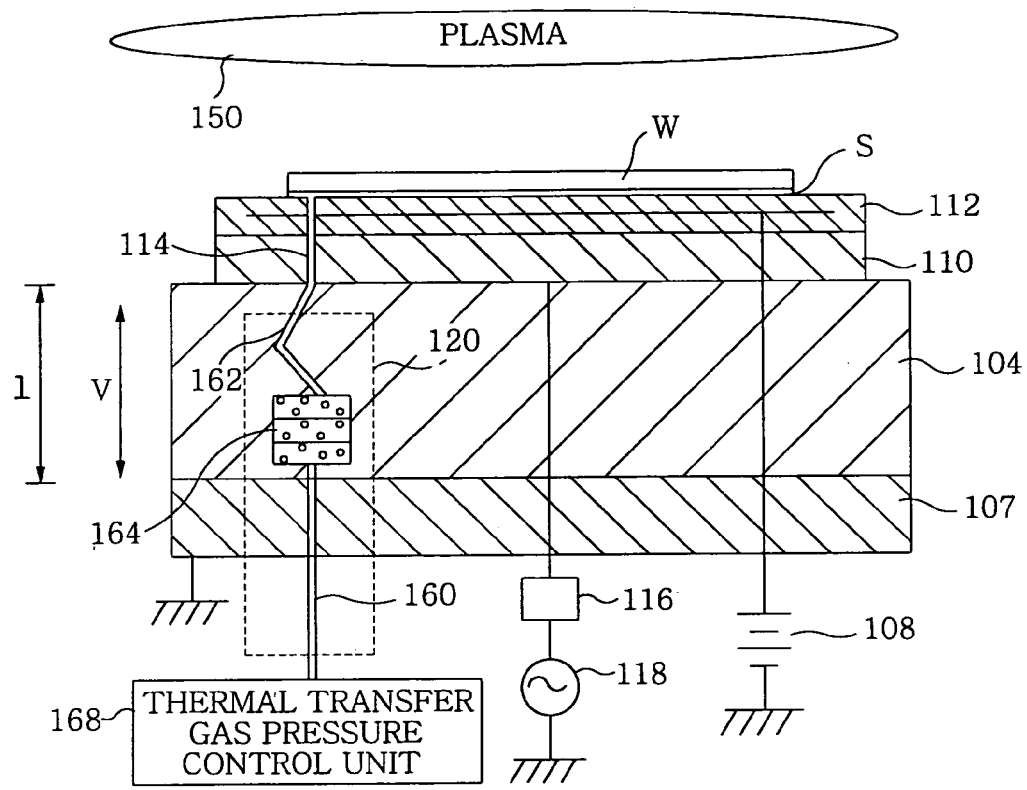
FIG. 2 illustrates a schematic cross sectional view of the inside of the plasma etching device 100 in accordance with a first embodiment.
Figure 3:
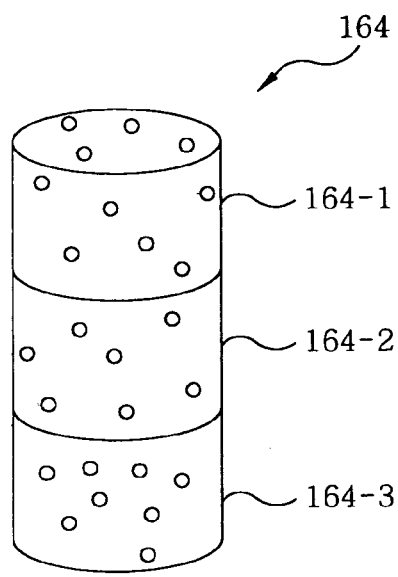
FIG. 3 describes a schematic perspective view of a configuration of a block unit 164 (a gas discharge suppressing member) for thermal transfer gas feed pipe.
Figure 4:
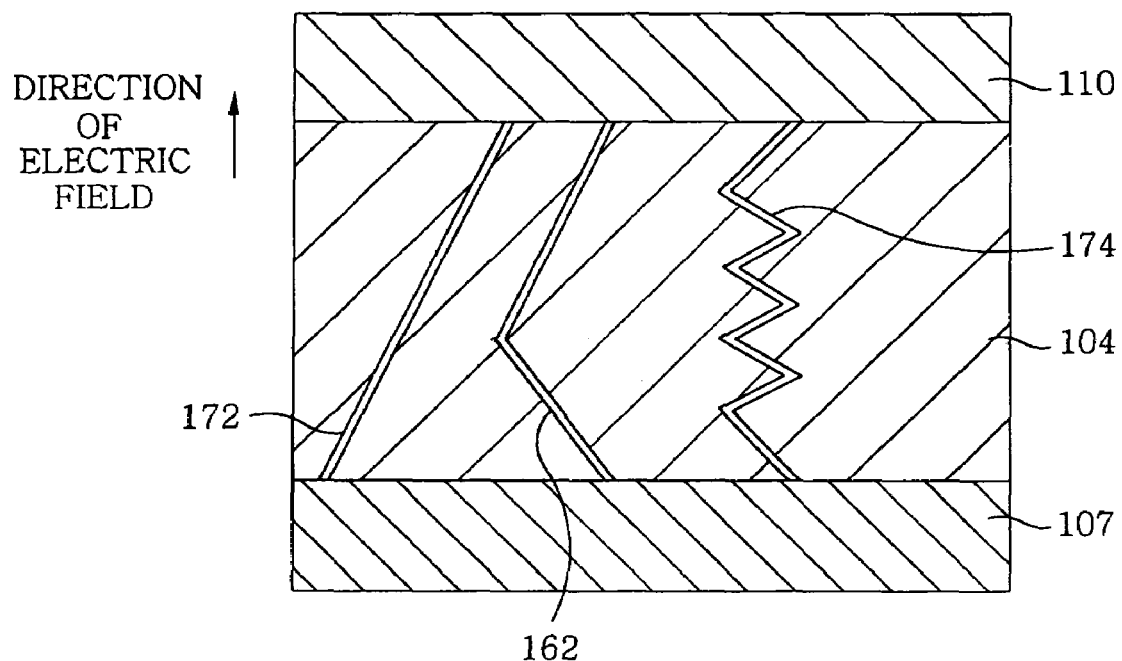
FIG. 4 offers a schematic cross sectional view of exemplary configurations of an upper thermal transfer gas feed pipe 162.

Hereinafter, a detailed configuration of the thermal transfer gas feed unit 120 in accordance with the first embodiment will be described with reference to FIGS. 2 to 4. FIGS. 2, 3 and 4 are a schematic cross sectional view of an inner configuration of the plasma etching device 100 in accordance with the first embodiment, a schematic perspective view of a configuration of a block unit 164 for thermal transfer gas feed pipe, and a schematic cross sectional view of exemplary configurations of an upper thermal transfer gas feed pipe 162, respectively.

As shown in FIG. 2, the thermal transfer gas feed unit 120 in accordance with the first embodiment includes a lower thermal transfer gas feed pipe 160 connected to the thermal transfer gas pressure control unit 168; the block unit 164 for thermal transfer gas feed pipe (hereinafter simply referred to as the block unit) employed as a thermal transfer gas discharge suppressing member disposed on top thereof, and the upper thermal transfer gas feed pipe 162 connecting the block unit 164 to the minute space S. Further, a conductive member 107 provided under the insulating member 104 in FIG. 2 is grounded and corresponds to an outer wall of a bottom portion of the processing chamber 102 in FIG. 1.

The block unit 164 in an example shown in FIG. 3 has three blocks 164-1, 164-2 and 164-3 for thermal transfer gas feed pipe (hereinafter simply referred to as blocks). An appropriate number of blocks can be chosen according to a voltage level generated in a process and thus is not necessarily limited to three. For example, it can be one, two, four or more. The blocks 164-1, 164-2 and 164-3 may be formed of, e.g., a porous ceramic. Pores are randomly formed in each block 164-1, 164-2 or 164-3 and whereby thermal transfer gas can be supplied via paths of random directions.

As described above, the block made of porous ceramic enables the thermal transfer gas to be supplied via random paths, which in turn can shorten straight passageways of the thermal transfer gas along a direction of electric field, in comparison with the conventional block made of resin; and energy of the electrons in the thermal transfer gas can be suppressed to be low. Accordingly, discharge can be prevented with a small number of blocks. Further, the responsiveness of the thermal transfer gas is high and thus the temperature of the object to be processed can be regulated accurately since a large number of blocks need not be used. Furthermore, the block made of porous ceramic has excellent voltage resistance and heat resistance, compared with the one made of resin, and thus is not easily melted in the event of occurrence of discharge in other parts.

Additionally, it is preferable to form an "<" character-shaped upper thermal transfer gas feed pipe (hereinafter simply referred to as an upper pipe) 162, an upper pipe 172 inclined in a single direction with respect to the direction of electric field, or a zigzag shaped upper pipe 174, as shown in FIG. 4, in order to make the electrons in the thermal transfer gas to collide against a side wall of the upper pipe to decrease the energy. As a result, discharge of the thermal transfer gas can be prevented. Upper thermal transfer gas feed pipe 162, upper pipe 172, and upper pipe 174 are examples of thermal transfer gas feed pathways.

Moreover, the above-mentioned block unit 164 and the upper pipe 162 are used in combination in the example of FIG. 2, but the thermal transfer gas feed unit 120 may only contain either one of them. The upper pipe 172 or 174 may also be used in combination with the block unit 164. In any case, discharge can be prevented; and since a large number of the blocks need not be employed, the responsiveness of the thermal transfer gas is high and the temperature of the object to be processed can be accurately controlled as well.

Embodiment 2

Figure 5A:
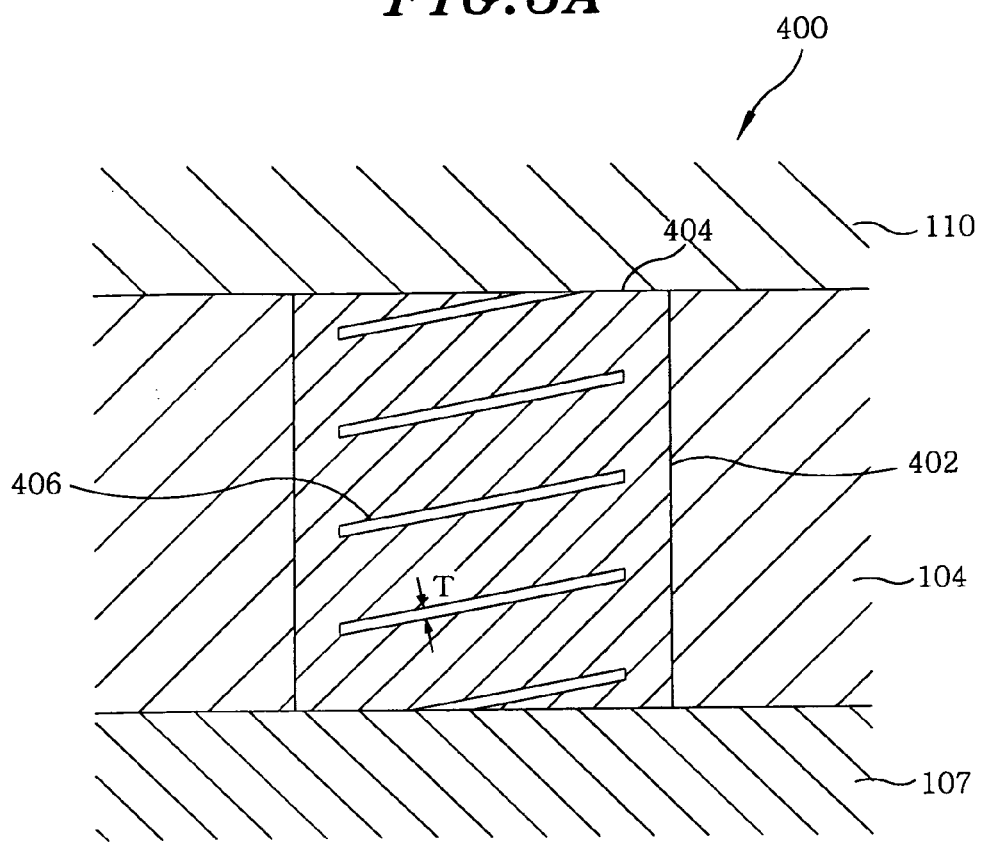
FIGS. 5A and 5B are schematic diagrams illustrating a thermal transfer gas feed unit 400 in accordance with a second embodiment.
Figure 5B:
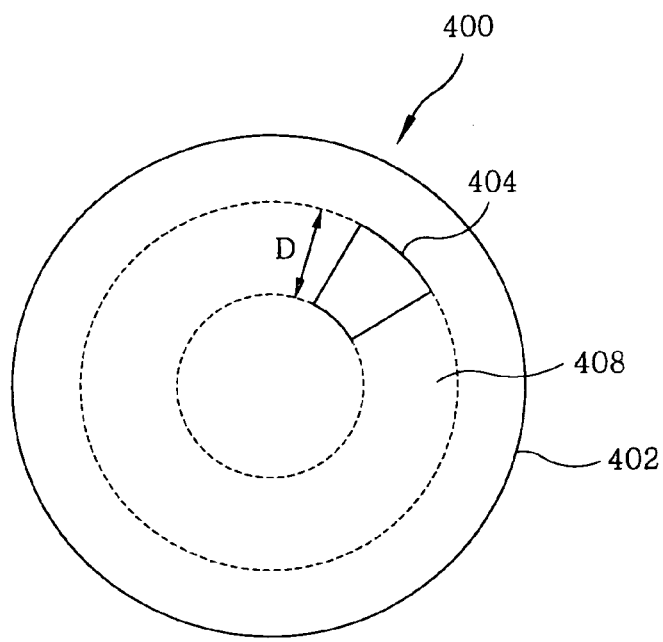

Hereinafter, a processing apparatus in accordance with a second embodiment will be described with reference to FIGS. 5A and 5B. The processing apparatus in accordance with the second embodiment and the processing apparatus 100 in accordance with the first embodiment differ only in the configuration of a thermal transfer gas feed unit and the repeated description is thus omitted. FIG. 5A is a schematic cross sectional view illustrating a thermal transfer gas feed unit 400 in accordance with the second embodiment; and FIG. 5B is a plan view of the thermal transfer gas feed unit 400.

As shown in FIG. 5A, the thermal transfer gas feed unit 400 is provided with a gas discharge suppressing member having an approximately cylindrical outer container 402 containing therein an inner container 408 with a thermal transfer gas feed pipe 406 formed in a spiral shape on an outer wall thereof. The inner container 408 and the outer container 402 are thermally bonded, so that the thermal transfer gas does not leak from the thermal transfer gas feed pipe 406. Further, insertion fitting in which a gap between the inner container 408 and the outer container 402 is kept small enough may be possible in lieu of thermally bonding. In a top view, an outlet 404 of the thermal transfer gas feed pipe 406 is formed as shown in FIG. 5B. The inner container 408 and outer container 402 are preferably formed of a high voltage resistant and heat resistant material with a low dielectric constant, such as quartz or Teflon (a registered trademark) to prevent easily melting and shorting of a passageway in the event of discharge in other parts disposed thereabove or therbelow.

An upper portion and a lower portion of the thermal transfer gas feed unit 400 are in contact with the lower electrode 110 and the grounded conductive member 107 (e.g., a bottom portion of an outer wall of the processing chamber 102), respectively. By the thermal transfer gas feed unit 400, the thermal transfer gas from the thermal transfer gas pressure control unit 168 passes through the thermal transfer gas feed pipe 406 and spirally rises in the thermal transfer gas feed unit 400. Then, it is supplied to the minute space S from the outlet 404 through the thermal transfer gas feed holes 114 provided in the electrostatic chuck 112.

When an amount of energy capable of generating discharge is accumulated in electrons by collisions between the electrons and He molecules, discharge occurs. However, when a cross sectional thickness of the thermal transfer gas feed pathway in the direction of electric field is sufficiently small, the energy accumulated in the electrons is low and thus discharge does not occur. For such reason, it is preferable that the cross sectional thickness of the thermal transfer gas feed pathway in the direction of electric field is chosen as to prevent the generation of discharge, though it may be larger than an electron mean free path value. For example, when the thermal transfer gas is a He gas, it is preferably equal to or less than 1 mm, and more preferably 0.5 to 1 mm. An exemplary calculation of the cross sectional thickness of the thermal transfer gas feed pathway along the direction of electric field for such a case will be described in detail in a third embodiment.

From the above, the cross sectional thickness T of the thermal transfer gas feed pipe 406, which corresponds to the thickness of the thermal transfer gas feed pathway in the direction of electric field, is preferably equal to or less than 1 mm, and more preferably 0.5 to 1 mm when gas flow rate and manufacturability are taken into account. Further, a width D of the thermal transfer gas feed pipe 406 is chosen sufficiently large, e.g., 5 mm or greater, to guarantee satisfactory responsiveness or flow rate of the thermal transfer gas.

Figure 6A:
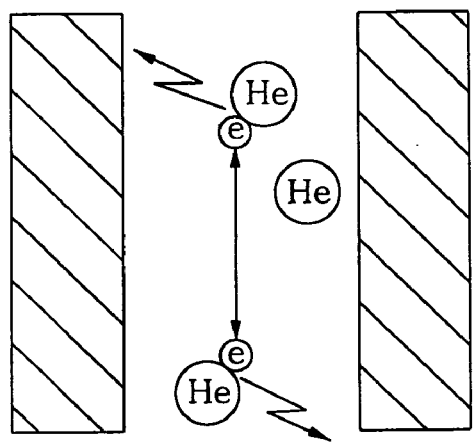
FIGS. 6A and 6B are explanatory diagrams illustrating the function of a gas discharge suppressing member in a thermal transfer gas feed pathway.
Figure 6B:
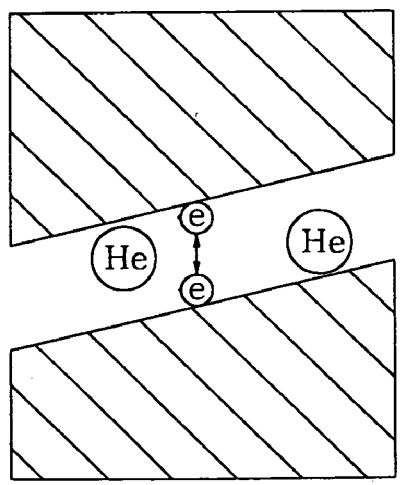

As described above, the energy of the electrons in the thermal transfer gas is decreased and discharge can be prevented by installing the thermal transfer gas feed unit 400 including the thermal transfer gas feed pipe 406 inclined with respect to the direction of electric field throughout the entire length (distance 1) of the electric field space in the direction of electric field between the lower electrode 110 and the conductive member 107 depicted in FIG. 2. For example, when the thermal transfer gas feed pathway is conventionally formed along the direction of electric field as shown in FIG. 6A, electrons can be easily accelerated and discharged due to a large space of the direction of electric field. On the contrary, when the thermal transfer gas feed pathway is formed to be inclined with respect to the direction of electric field as in the present invention shown in FIG. 6B, acceleration of electrons can be suppressed by the wall and thus discharge can be prevented due to a small space along the direction of electric field.

Further, high responsiveness and sufficient flow rate of the thermal transfer gas can be obtained and the temperature of the object to be processed can be accurately controlled by virtue of a sufficiently wide width D of the thermal transfer gas feed pipe 406. As described, a processing apparatus for a particular pressure range and the kind of gas to be used can be adequately designed by optimizing the width and the height of the thermal transfer gas feed pipe.

Furthermore, the thermal transfer gas feed unit 400 in accordance with the second embodiment may be used in combination with block unit 164 for thermal transfer gas feed pipe in accordance with the first embodiment. Still further, the thermal transfer gas feed unit 400 can be fabricated as a separate unit, which can later be assembled to the insulating member 104 by jointing with bolts and the like, whereby the manufacture thereof can be facilitated.

Embodiment 3

Figure 7A:
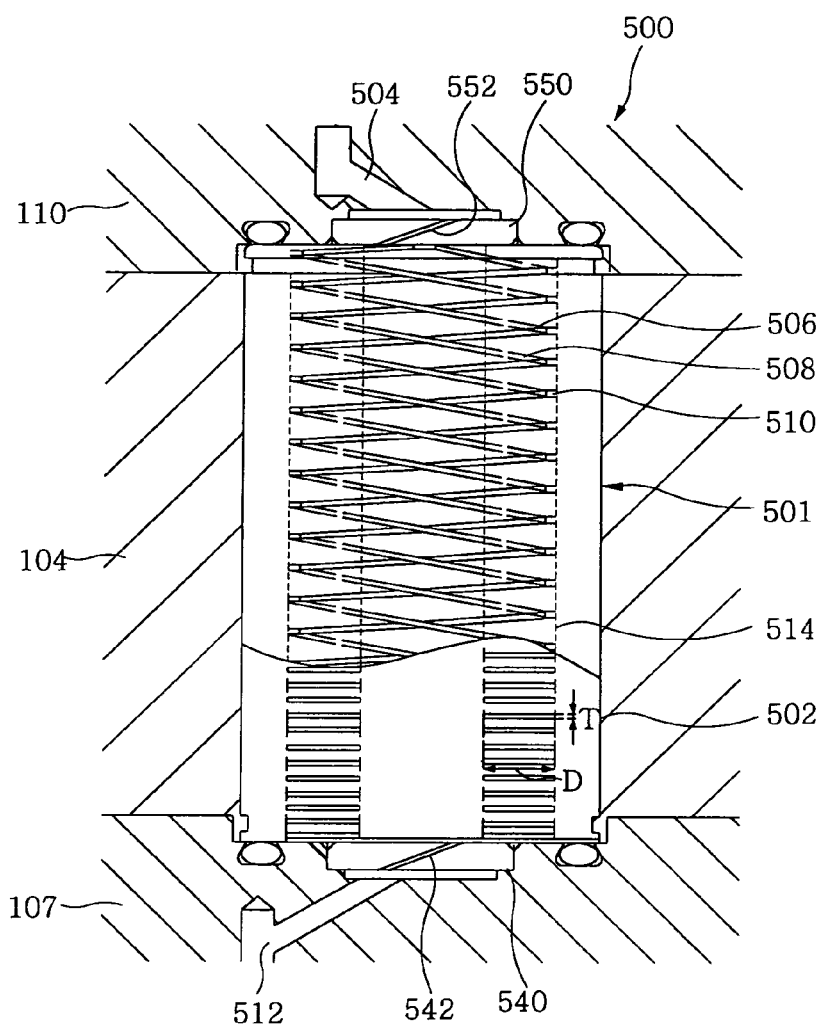
FIGS. 7A and 7B are schematic views of a thermal transfer gas feed unit 500 in accordance with a third embodiment.
Figure 7B:
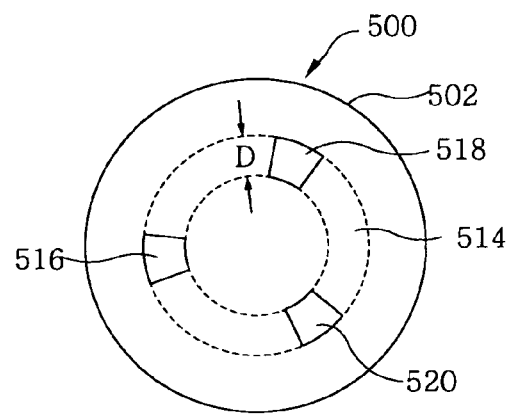

Hereinafter, a processing apparatus in accordance with a third embodiment will be described in detail with reference to FIGS. 7A and 7B. The processing apparatus in accordance with the third embodiment and the processing apparatus 100 in accordance with the first embodiment have the same construction with an exception of a thermal transfer gas feed unit and the a repeated description thereof is thus omitted. FIG. 7A is a schematic cross sectional view illustrating a thermal transfer gas feed unit 500 in accordance with the third embodiment. FIG. 7B is a plan view of the thermal transfer gas feed unit 500.

As shown in FIGS. 7A and 7B, the thermal transfer gas feed unit 500 is provided with a gas discharge suppressing member 501 having an inner container 514 in an approximately cylindrical outer container 502. The inner container 514 has a spirally formed thermal transfer gas feed pipes 506, 508 and 510 at an outer wall thereof. The inner container 514 and outer container 502 are thermally bonded, so that a likelihood of leakage of the thermal transfer gas from the thermal transfer gas feed pipes 506, 508 and 510 is eliminated thus reliably guaranteeing a flow of the thermal transfer gas along the spiral thermal transfer gas feed pipes. Further, insertion fitting in which a gap between the inner container 514 and the outer container 502 is kept small enough may replace thermally bonding. In a top view, outlets 516, 518 and 520 of the thermal transfer gas feed pipes 506, 508 and 510 are formed as shown in FIG. 7B.

The inner container 514 and outer container 502 are preferably formed of a high voltage resistant and heat resistant material with a low dielectric constant, such as quartz or Teflon (a registered trademark) to prevent easily melting and shorting of a passageway in the event of discharge in other parts disposed thereabove or therebelow.

An upper portion and a lower portion of the thermal transfer gas feed unit 500 are in contact with the lower electrode 110 and the grounded conductive member 107 (e.g., the bottom portion of the outer wall of the processing chamber 102), respectively. By the thermal transfer gas feed unit 500, the thermal transfer gas from the thermal transfer gas pressure control unit 168 passes through a thermal transfer gas feed pipe 512 and spirally rises along three divided paths in the thermal transfer gas feed unit 500. Then, it is supplied to the minute space S from the outlets 516, 518 and 520 through a thermal transfer gas feed pipe 504 and the thermal transfer gas feed holes 114 provided in the electrostatic chuck 112.

It is preferable that the cross sectional thickness T of the thermal transfer gas feed pipes 506, 508 and 510 in the direction of electric field is chosen such that in practice the generation of discharge in the thermal transfer gas feed pipe can be prevented. For example, when the thermal transfer gas is a He gas, the thickness of the thermal transfer gas feed pipes 506, 508 and 510 is preferably equal to or less than 1 mm, and more preferably 0.5 to 1 mm when gas flow rate and manufacturability are taken into account. The cross sectional width D of the thermal transfer gas feed pipes 506, 508 and 510 is preferably equal to or greater than about 5 mm.

Figure 8:
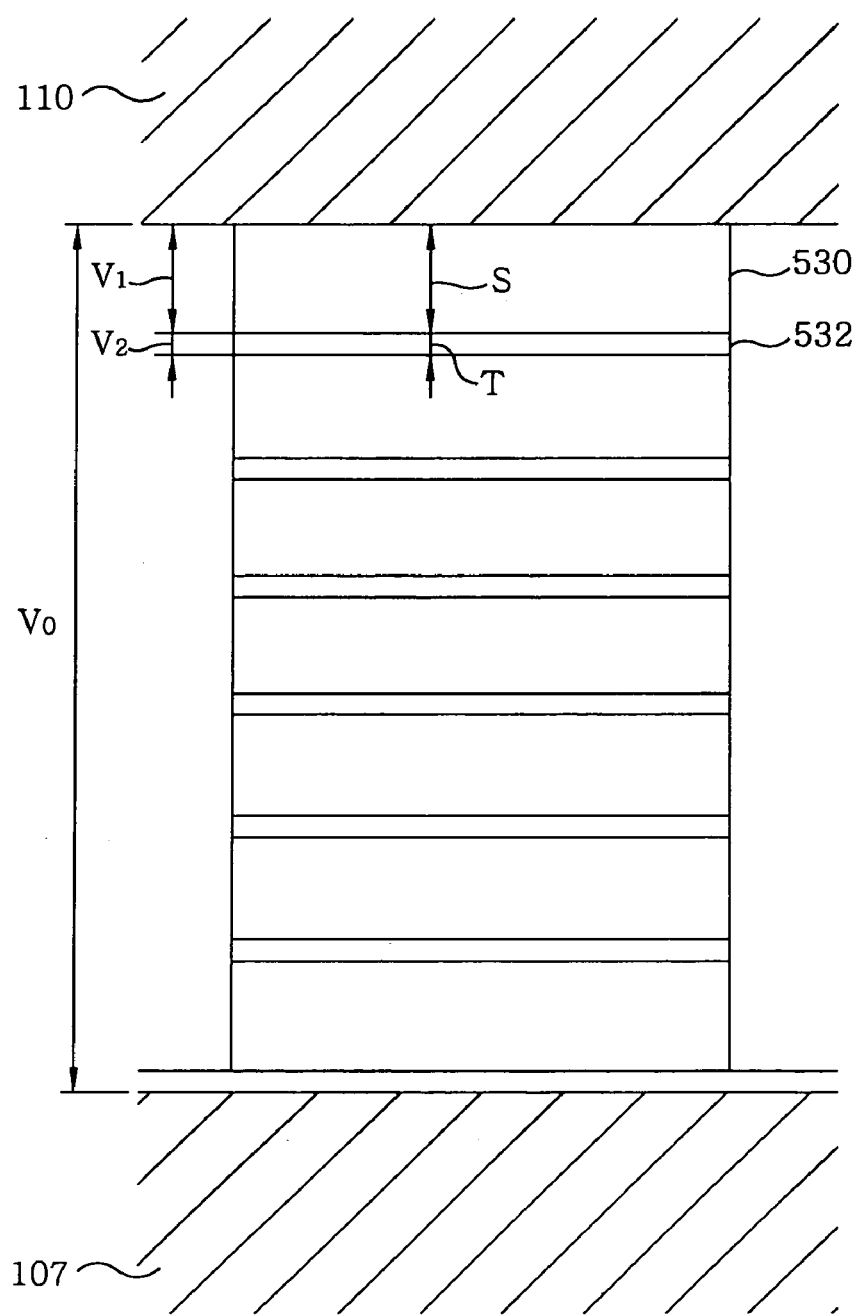
FIG. 8 provides a model used in calculating a thickness T of a thermal transfer gas feed pipe.

Hereinafter, an illustration of calculating the cross sectional thickness T of the thermal transfer gas feed pipes 506, 508 and 510 in the direction of electric field will be shown. In order to simplify the calculation, the gas discharge suppressing member 501 shown in FIG. 7A is treated as N-stage series capacitors, in which the spiral thermal transfer gas feed pipes 506, 508 and 510 are assumed as a plurality of He layers 532 and dielectric layers 530 are stacked between the He layers 532 as shown in FIG. 8. Let the thickness of a dielectric layer 530 be S; the thickness of a He layer 532, T; a voltage applied to the entire gas discharge suppressing member 501, $V_0$; a voltage applied to one dielectric layer 530, $V_1$; and a voltage applied to one He layer 532, $V_2$.

$$V_0 = N(V_1 + V_2) \tag{1}$$

Further, the above Eq. (1) is reduced to Eq. (2) using a formula (Q=CV) for charge quantity Q and electrostatic capacitance C and the like.

$$V_2 = V_0[\in_1 / \{N(S/T + \in_1)\}] \tag{2}$$

wherein $\epsilon_1$ refers to a dielectric constant of the dielectric layer 530. Further, since a dielectric constant $\epsilon_2$ of the He layer 532 is close to 1, it is assumed that $\epsilon_2=1$.

It is preferable that the divided voltage $V_2$ applied to a single He layer 532 is calculated by applying particular numerical values into Eq. (2) and the thickness T of the He layer 532 is chosen such that the divided voltage $V_2$ does not exceed the discharge starting voltage in accordance with Paschen's law shown in FIG. 9.

Figure 9:
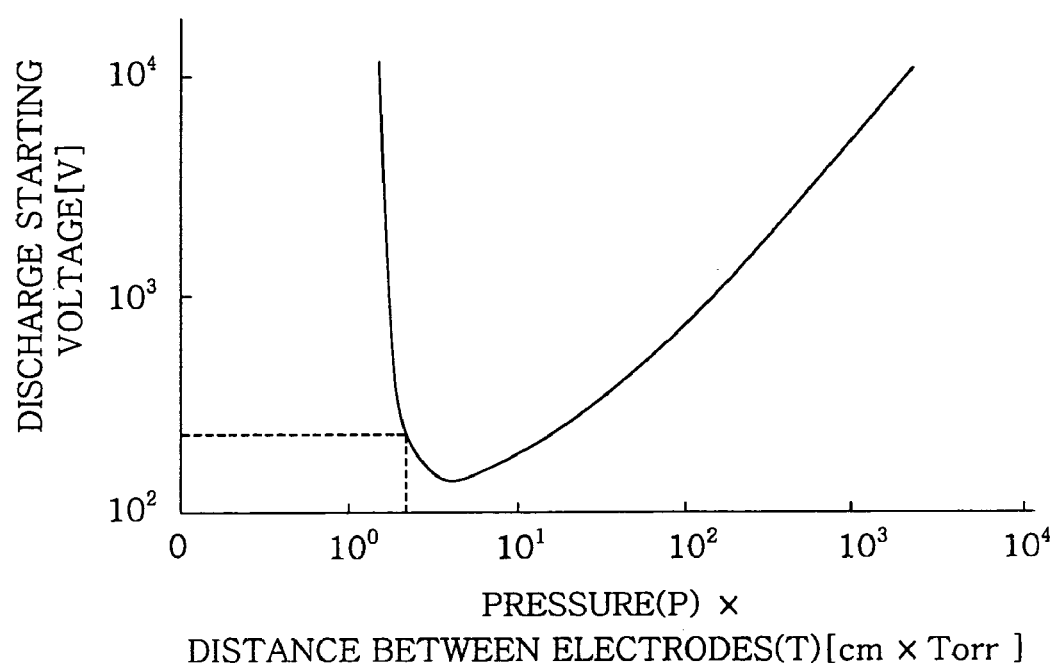
FIG. 9 is a graphical representation of a discharge starting voltage curve according to Paschen's law.

FIG. 9 is a graphical representation of a discharge starting voltage curve in accordance with Paschen's law, wherein the x-axis denotes, in a logarithmic scale, the product of the pressure P of the thermal transfer gas and the thickness T of the He layer 532 which is a distance between electrodes; and the y-axis denotes the discharge starting voltage in a logarithmic scale. For example, as shown in FIG. 9, when pressure P×thickness T of the He layer 532 is 2.0 [cm×Torr], the discharge starting voltage is about 200 V. If an actually calculated value of, e.g., $V_2=54$[V], is obtained by substituting specified values such as the above thickness T of the He layer 532, $V_0=2500$ [V], and N=17 into the Eq. (2), discharge does not occur since the discharge starting voltage is less than about 200 V which gives a margin of approximately 4 times.

When actually determining the thickness T of the thermal transfer gas feed pipes 506, 508 and 510, specific numerical values are entered into the Eq. (2), in which it is preferable to determine the thickness T of the He layer 532, i.e., the thickness T of the thermal transfer gas feed pipes 506, 508 and 510 not to exceed the discharge starting voltage in accordance with Paschen's law. The thickness T of the thermal transfer gas feed pipes 506, 508 and 510 determined based on such principles, by employing, e.g., a He gas as the thermal transfer gas is preferably equal to or less than 1 mm, and more preferably about 0.5 to 1 mm.

As described above, the energy of the electrons in the thermal transfer gas can be decreased and discharge can be prevented by installing the thermal transfer gas feed unit 500 inclined with respect to the direction of electric field throughout the entire region (distance 1) in the electric field direction between the lower electrode 110 and the conductive member 107 as shown in FIG. 2. Further, high responsiveness and sufficient flow rate of the thermal transfer gas can be obtained and an accurate control of the temperature of the object to be processed can be achieved as well by slanting the thermal transfer gas feed pathway with respect to the direction of electric field and providing three paths. Furthermore, the thermal transfer gas feed unit 500 in accordance with the third embodiment may be used in combination with block unit 164 for thermal transfer gas feed pipe in accordance with the first embodiment.

Still further, the thermal transfer gas feed unit 500 can be fabricated as an independent part and then can be assembled with the insulating member 104 by attaching thereto by bolts and the like, which in turn facilitates the manufacture thereof. Moreover, the above embodiment contains three paths in the thermal transfer gas feed unit 500, but the number of the paths may be adjusted according to the required conductance.

As shown in FIG. 7, the gas discharge suppressing member 501 is provided with connecting members 540 and 550 disposed at a portion connected to the thermal transfer gas feed pipe 512, i.e., at a boundary bordering with the conductive member 107, and at a portion connected to the thermal transfer gas feed pipe 504, i.e., at a boundary bordering with the lower electrode 110, respectively. Thermal transfer gas passageways 542 and 552 inclined with respect to the direction of electric field are respectively formed in the connecting members 540 and 550 at boundary regions bordering with the gas discharge suppressing member 501.

Hereinafter, an operation and effect of the thermal transfer gas passageways 542 and 552 formed at the boundaries between the gas discharge suppressing member 501 and the conductive member 107 and between the gas discharge suppressing member 501 and the lower electrode 110, respectively, will be described in detail with reference to drawings. For comparison, a thermal transfer gas passageway formed along the direction of electric field at a boundary bordering with the conductive member 107 is depicted in FIG. 10A, and a thermal transfer gas passageway formed to be inclined with respect to the direction of electric field at a boundary bordering with the conductive member 107 is depicted in FIG. 10B.

Figure 10A:
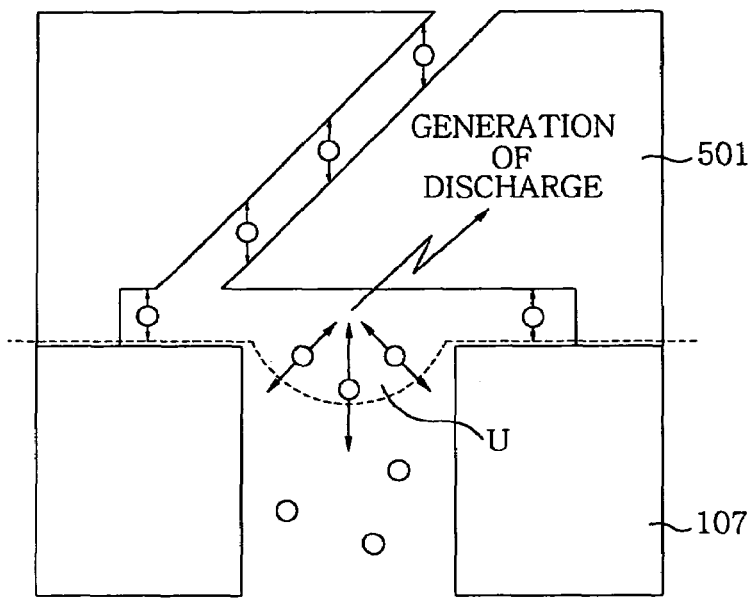
FIGS. 10A and 10B are explanatory diagrams illustrating the function of a boundary region between a gas discharge suppressing member and a conductive member.

When a power is applied to the lower electrode 110 in FIG. 10A, difference in electric potential is developed between the gas discharge suppressing member 501 and the grounded conductive member 107. For this reason, contour lines of electric potential (shown with a dashed line) at the boundary between the gas discharge suppressing member 501 and the conductive member 107 protrudes toward the thermal transfer gas passageway due to the presence thereof along the direction of electric field. In such a case, space U having electric potential is generated and thus electrons may be accelerated and collide with He molecules to create discharge (particularly, spark discharge).

Figure 10B:
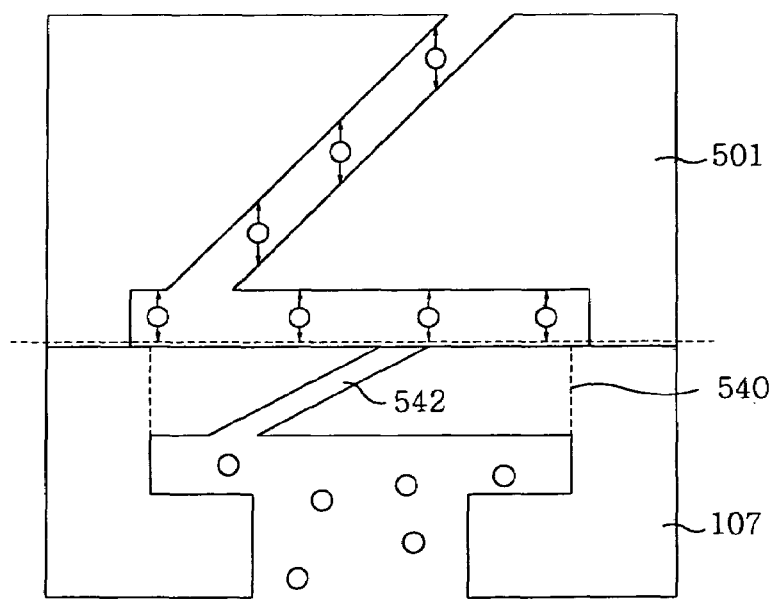

However, by providing the connecting member 540 having the thermal transfer gas passageway 542 at the boundary between the conductive member 107 and the gas discharge suppressing member 501 as shown in FIG. 10B, the space at the boundary between the gas discharge suppressing member 501 and the conductive member 107 where contour lines of electric potential (shown with a dashed line) protrudes can be minimized and acceleration of electrons can be prevented as well. Consequently, discharge (particularly, spark discharge) can be prevented at the boundary between the conductive member 107 and the gas discharge suppressing member 501. In the same way, discharge (particularly, spark discharge) can be prevented at the boundary between the gas discharge suppressing member 501 and the lower electrode 110 by installing the connecting member 550 having the thermal transfer gas passageway 552 formed therein.

Figure 11:
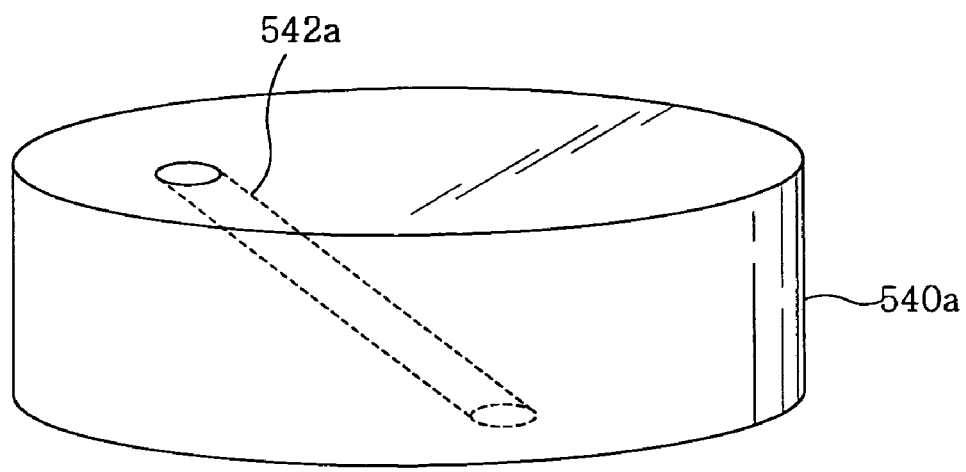
FIG. 11 depicts an example of a connecting member.
Figure 12:
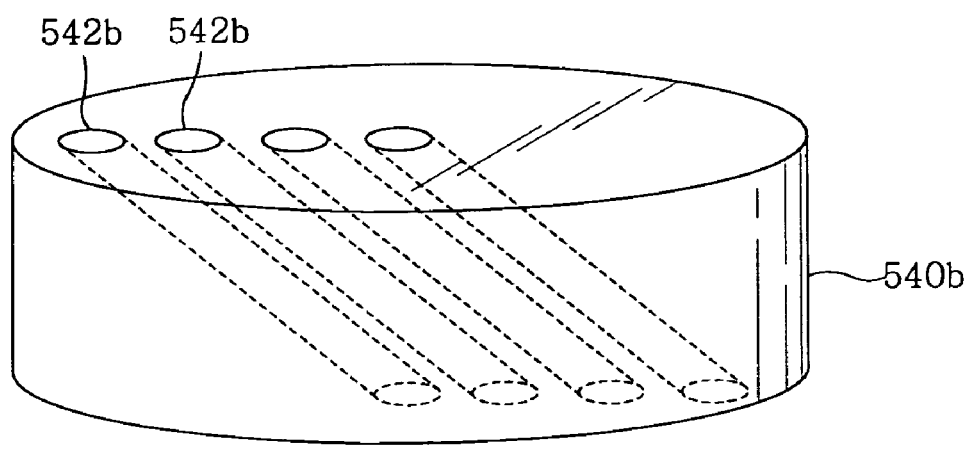
FIG. 12 sets forth another example of the connecting member.
Figure 13:
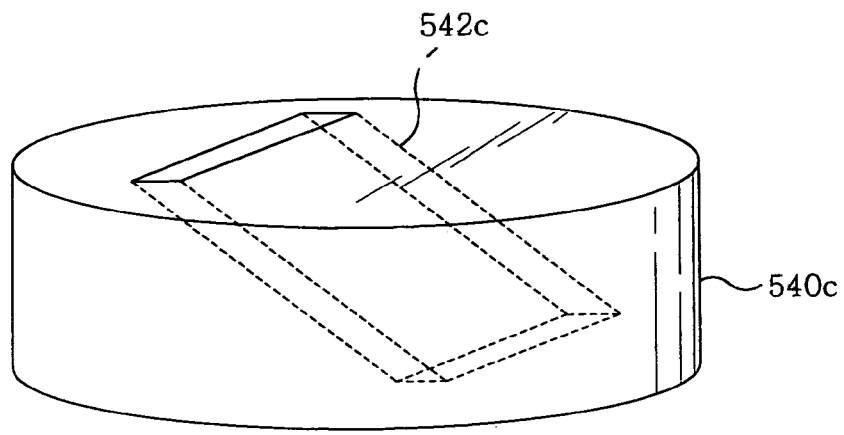
FIG. 13 represents yet another example of the connecting member.
Figure 14:
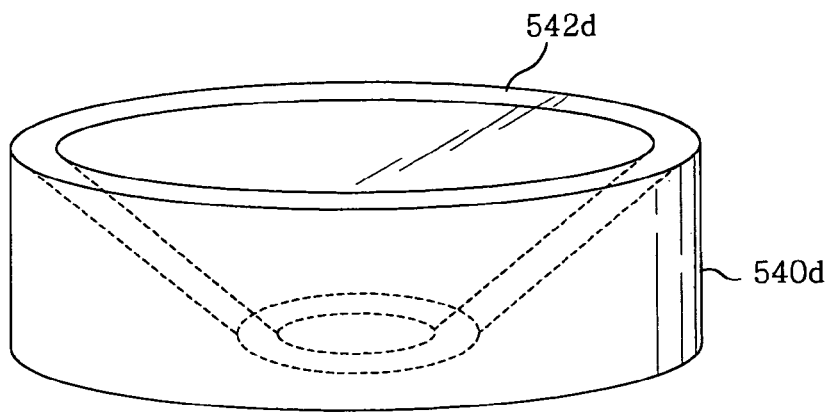
FIG. 14 shows still another example of the connecting member.

As the thermal transfer gas passageway of the connecting member 540, for example, a single thermal transfer gas passageway 542a inclined with respect to the direction of electric field may be formed as shown in FIG. 11 and, further, a plurality of thermal transfer gas passageways 542b may be formed as shown in FIG. 12. Furthermore, a thermal transfer gas passageway 542c shaped like an inclined plate with a specific width may be formed as shown in FIG. 13 and a mortar shape thermal transfer gas passageway 542d may be formed as shown in FIG. 14. Among them, the thermal transfer gas passageways 542b to 542d depicted in FIGS. 12 to 14 are preferable in the sense that a flow rate of thermal transfer gas can maximized. Additionally, the thermal transfer gas passageway 542d depicted in FIG. 14 is preferable for convenience in manufacture thereof.

Figure 15:
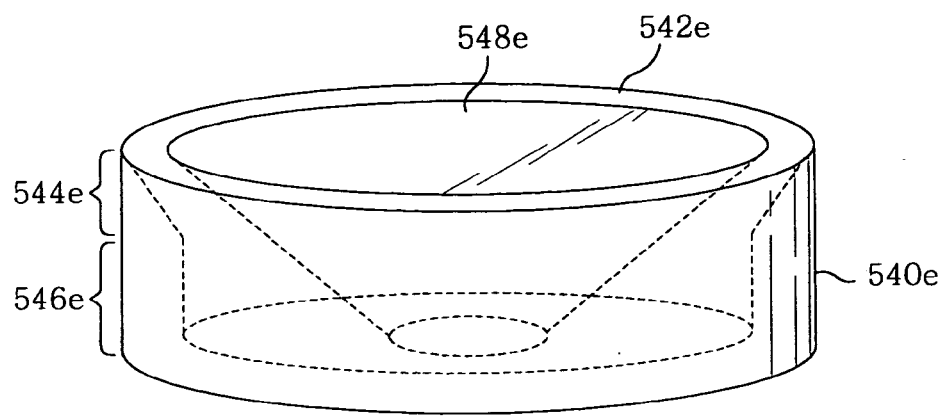
FIG. 15 illustrates still another example of the connecting member.

Moreover, FIG. 15 shows an example wherein the thermal transfer gas passageway shown in FIG. 14 is modified to facilitate passing of the thermal transfer gas. An inner wall of the thermal transfer gas passageway 542e and an outer wall of a mortar unit 548e of a connecting member 540e are formed of a mortar shape. Further, an outer wall of the thermal transfer gas passageway 542e is continuously formed of an inclined portion 544e slanted with respect to the direction of electric field along the inner wall and a vertical portion 546e disposed along the direction of electric field.

As described above, by forming a part of a gas discharge suppressing member 501 side and a conductive member 107 side of the transfer gas passageway 542e to be slanted and vertically disposed along the direction of electric field, respectively, discharge (particularly, spark discharge) can be prevented since protruding of the electric field can be kept to minimum by the inclined portion 544e of the thermal transfer gas passageway 542e, and also the flow of the thermal transfer gas can be further facilitated since the conductive member 107 side can be enlarged. In addition, even though the conductive member 107 side is wide as in the connecting member 540e, discharge does not occur because there is no electric field at the conductive member 107 side and thus the electrons do not oscillate.

Further, the thermal transfer gas passageway 552 of the connecting member 550 may be formed to have the configurations as depicted in FIGS. 11 to 15. It is preferable to invent the connecting members 540a to 540e depicted in FIGS. 11 to 15 are inverted when being used as the connecting member 550.

Figure 16A:
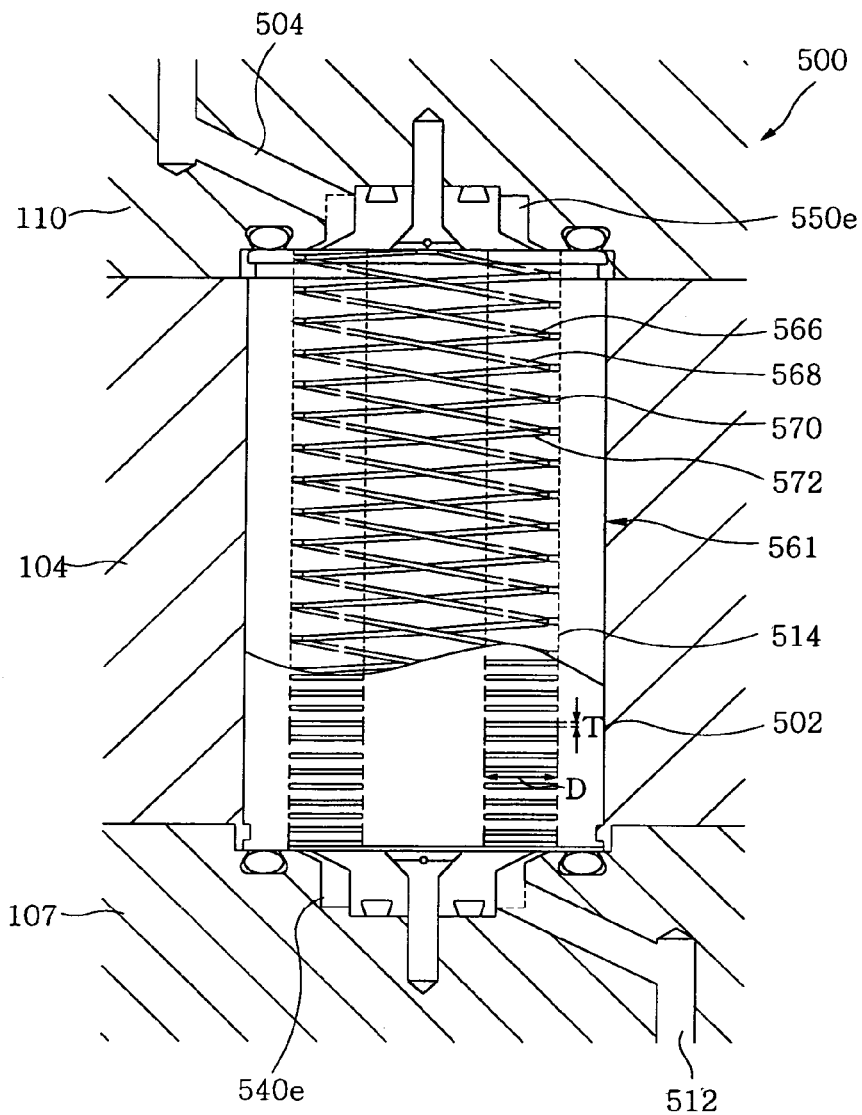
FIGS. 16A and 16B describe a further example of a gas discharge suppressing member.
Figure 16B:
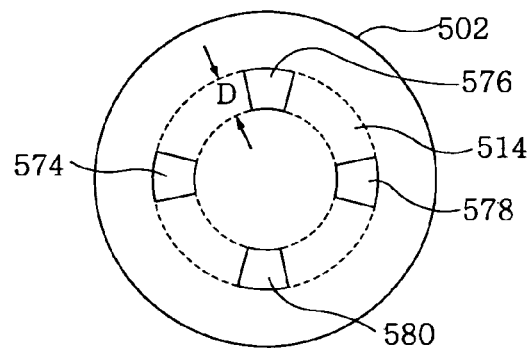

Furthermore, though FIG. 7 describes the gas discharge suppressing member 501 provided with three spiral thermal transfer gas feed pipes 506, 508 and 510, the number of spiral thermal transfer gas feed pipes is not limited thereto but may be two or less or four or more. A gas discharge suppressing member 561 provided with four spiral thermal transfer gas feed pipes 566, 568, 570 and 572 is shown in FIGS. 16A and 16B. FIG. 16A is a schematic cross sectional view of the thermal transfer gas feed unit 500 and FIG. 16B is a plan view thereof. In a top view, outlets 574, 576, 578 and 580 of the thermal transfer gas feed pipes 566, 568, 570 and 572 are provided as shown in FIG. 16B. Moreover, a connecting member 550e (including a mortar unit installed at the connecting member 550e) is attached to the gas discharge suppressing member 561 by screws.

The above-mentioned gas discharge suppressing member is preferably formed of a material having a dielectric constant $\in_1$ equal to or less than 4. For example, the material may be quartz or a fluorine resin such as polytetrafluoroethylene (PTFE), polychlorotrifluoroethylene (PCTFE), tetrafluoroethylene-perfluoroalkyl-vinyl ether copolymer resin (PFA), tetrafluoroethylene-hexafluoropropylene copolymer resin (PFEP), and polyvinylidenefluoride resin (PVDF). Consequently, according to the above-mentioned Eq. (2), the thickness T of the He layer 532, i.e., the thickness T of the thermal transfer gas feed pathway, can be larger since the voltage $V_2$ applied to one He layer 532 can be lower.

Embodiment 4

Figure 17:
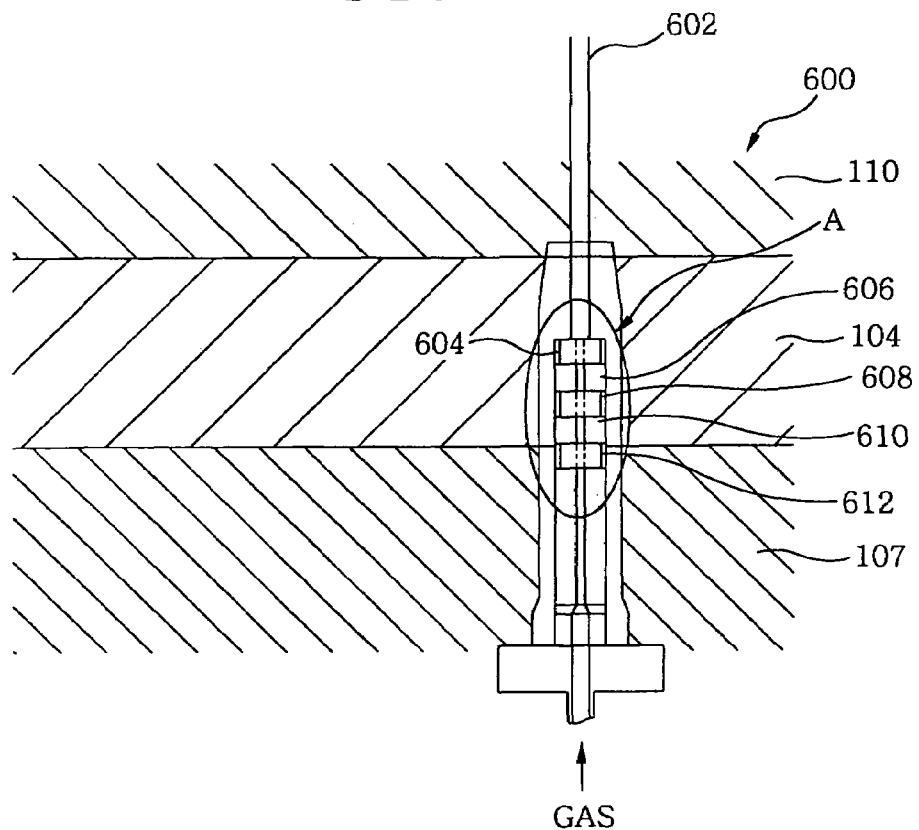
FIG. 17 is a schematic cross sectional view of a thermal transfer gas feed unit 600 in accordance with a fourth preferred embodiment.
Figure 18:
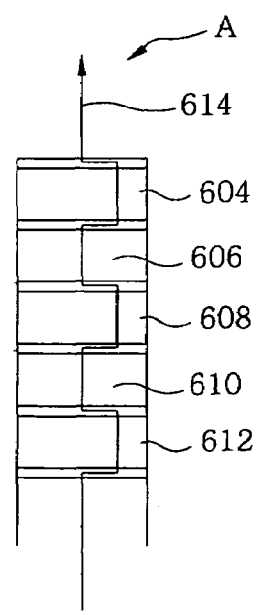
FIG. 18 is an enlarged view of a portion A of FIG. 17.

Hereinafter, a processing apparatus in accordance with a fourth embodiment will be described with reference to FIG. 17. The processing apparatus in accordance with the fourth embodiment and the processing apparatus 100 in accordance with the first embodiment have the same construction with an exception of the thermal transfer gas feed unit 120 and a repeated description is thus avoided. FIG. 17 shows a schematic cross sectional view of a thermal transfer gas feed unit 600 in accordance with the fourth embodiment. FIG. 18 is an enlarged view of a portion A of FIG. 17; and FIGS. 19A and 19B are plan views of blocks in accordance with the fourth embodiment.

As shown in FIG. 17, the thermal transfer gas feed unit 600 in accordance with the fourth embodiment has a straight upper pipe 602 and blocks 604, 606, 608, 610 and 612 connected thereto. As shown in FIG. 18, the blocks 604, 606, 608, 610 and 612 serve to shorten a straight portion of the thermal transfer gas path, as in a thermal transfer gas path 614.

Figure 19A:
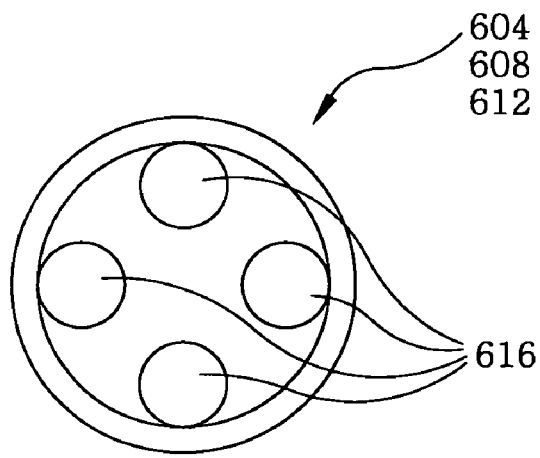
FIGS. 19A and 19B are plan views of blocks (a gas discharge suppressing member) in accordance with the fourth embodiment.
Figure 19B:
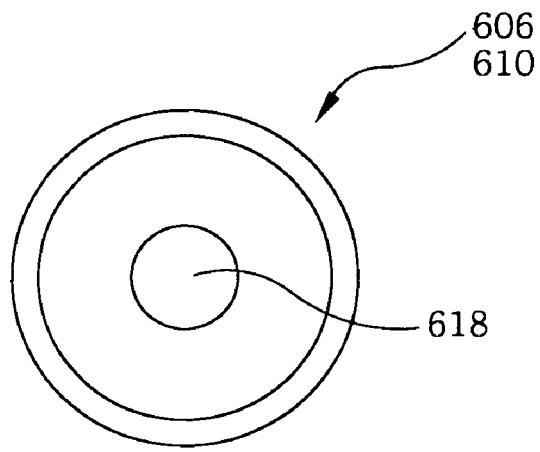
Figure 20:
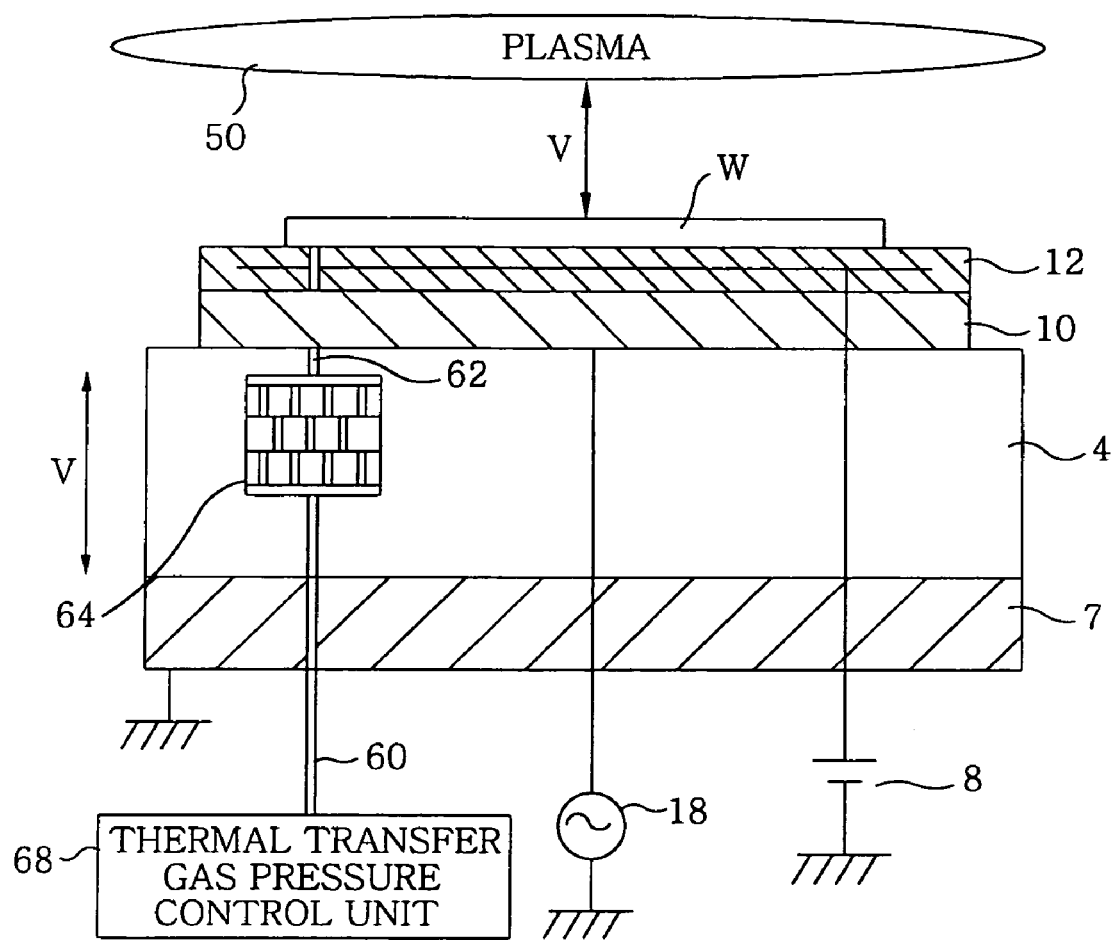
FIG. 20 is a schematic cross sectional view illustrating the inside of a processing chamber of a conventional processing apparatus.
Figure 21:
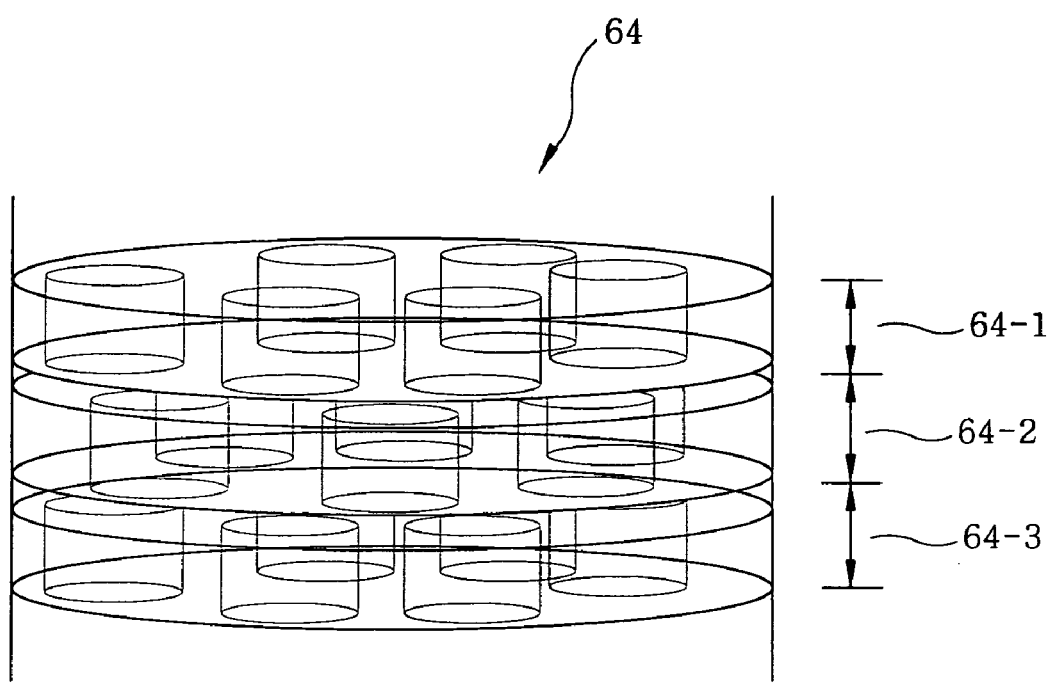
FIG. 21 is a schematic diagram of a conventional block for thermal transfer gas feed pipe.

That is, as shown in FIGS. 19A and 19B, two kinds blocks with different structures are alternately arranged, in which the thermal transfer gas passes through a peripheral portion 616 in the blocks 604, 608 and 612 and through a central portion 618 in the blocks 606 and 610. Accordingly, every time the thermal transfer gas collides with a bottom portion of each block, the path thereof is changed as in the thermal transfer gas path 614. Further, the thermal transfer gas flows without fail normal to the direction of electric field as much as the distance between the peripheral portion and the central portion of the block. Thus, the straight portions of the thermal transfer gas path can clearly be shortened and the energy of the electrons in the thermal transfer gas can be remarkably decreased.

Therefore, discharge can be prevented by using the thermal transfer gas feed unit 600 in accordance with the fourth embodiment since the energy of the electrons in the thermal transfer gas is decreased by the blocks. Further, responsiveness of the thermal transfer gas can be high and the temperature of the object to be processed can be controlled accurately since a large number of blocks need not be employed.

Furthermore, although the number of the blocks employed is five in the illustrated embodiment, it is not limited thereto and may be changed according to processing conditions of the object to be processed. Still further, the blocks may be used in combination with the upper pipes 162 and 172 or the like in accordance with the first embodiment.

While the invention has been shown and described with respect to the preferred embodiments with reference to the accompanying drawings, the present invention is not limited thereto. It will be understood by those skilled in the art that various changes and modifications may be made without departing from the spirit and scope of the invention as defined in the following claims.

For example, though a plasma etching device has been described as an example of the processing apparatus in accordance with the present invention, the present invention is not limited to thereto and can be applied to various devices for performing a process by introducing a processing gas into a processing chamber, such as a CVD device, a sputtering device and an ashing device.

As described above, in accordance with the present invention, there is provided a thermal transfer gas feed pipe for supplying a thermal transfer gas to the minute space under a bottom surface of an object to be processed in order to control the object to be processed to a required temperature, wherein the thermal transfer gas feed pipe is inclined with respect to the direction of electric field generated by a high frequency power. Further, there is provided a processing apparatus capable of decreasing energy of the electrons in the thermal transfer gas, preventing discharge and accurately controlling the temperature of an object to be processed by installing blocks for lessening the direct path.

INDUSTRIAL APPLICABILITY

The present invention is applicable to a processing apparatus used in manufacturing processes of a semiconductor device, and more particularly, to a processing apparatus and a gas discharge suppressing member capable of preventing a thermal transfer gas from discharging in a thermal transfer gas feed pipe for supplying the thermal transfer gas for temperature control to a bottom surface of the object to be processed.

What is claimed is:

1. A processing apparatus for performing a plasma process on a surface of an object to be processed by applying a high frequency power to an electrode installed in an airtight processing chamber, comprising:
a thermal transfer gas feed pathway for supplying a thermal transfer gas, for controlling a temperature of the object to be processed, to a space between the object to be processed and a holding unit installed on a lower electrode for attracting and holding the object to be processed, through an inner portion of an insulating member disposed under the lower electrode,
wherein the thermal transfer gas feed pathway extends across the insulating member and a portion of the thermal transfer gas feed pathway 1) is formed in a zigzag shape with respect to a direction of the axis of at least one electric field line in the insulating member during the plasma process and 2) is embedded within the insulating member and extended along a width of the insulating member, and
wherein the thermal transfer gas feed pathway is extended from an upper surface of the insulating member to a lower surface of the insulating member to extend across an entire height of the insulating member.

2. A processing apparatus for performing a plasma process on a surface of an object to be processed by applying a high frequency power to an electrode installed in an airtight processing chamber to convert a processing gas introduced therein into a plasma, comprising:
a thermal transfer gas feed pathway for supplying a thermal transfer gas, for controlling a temperature of the object to be processed, to a space between the object to be processed and a holding unit installed on a lower electrode for attracting and holding the object to be processed, through an inner portion of an insulating member disposed under the lower electrode,
wherein the thermal transfer gas feed pathway extends across the insulating member and a portion of the thermal transfer gas feed pathway 1) is formed in a zigzag shape wilt respect to a direction of the axis of at least one electric field line in the insulating member during the plasma process and 2) is embedded within the insulating member and extended along a width of the insulating member, and
wherein the thermal transfer gas feed pathway is extended from an upper surface of the insulating member to a lower surface of the insulating member to extend across an entire height of the insulating member.

3. The processing apparatus of claim 2, wherein a cross sectional thickness of the thermal transfer gas feed pathway is smaller than a width thereof.

4. The processing apparatus of claim 3, wherein the cross sectional thickness of the thermal transfer gas feed pathway is equal to or less than 1 mm.

5. The processing apparatus of claim 4, wherein the thermal transfer gas feed pathway is formed in a member having a dielectric constant equal to or less than 4.

6. The processing apparatus of claim 2, wherein the thermal transfer gas feed pathway is formed of a plurality of paths.

7. A gas discharge suppressing member installed in a thermal transfer gas feed pathway for supplying a thermal transfer gas, for controlling a temperature of the object to be processed, to a space between an object to be processed and a holding unit for attracting and holding the object to be processed in an airtight processing chamber, through an inner portion of an insulating member disposed under a lower electrode on which the holding unit is installed,
wherein the thermal transfer gas feed pathway extends across the insulating member and a portion of the feed pathway 1) is formed in a zigzag or a spiral shape with respect to a direction of the axis of at least one electric field line in the insulating member during the plasma process and 2) is embedded within the insulating member and extended along a width of the insulating member, and
wherein the thermal transfer gas feed pathway is extended from an upper surface of the insulating member to a lower surface of the insulating member to extend across an entire height of the insulating member.

8. The gas discharge suppressing member of claim 7, wherein the thermal transfer gas feed pathway is formed in the spiral shape, and a cross sectional thickness of the thermal transfer feed pathway in the gas discharge suppressing member is smaller than a width thereof.

9. The gas discharge suppressing member of claim 8, wherein the thermal transfer gas feed pathway is formed in the spiral shape, and the cross sectional thickness of the thermal transfer feed pathway in the gas discharge suppressing member is equal to or less than 1 mm.

10. The gas discharge suppressing member of claim 7, wherein the thermal transfer gas feed pathway is formed in the spiral shape, and the gas discharge suppressing member is formed of a material having a dielectric constant equal to or less than 4.

11. The gas discharge suppressing member of claim 7, wherein the thermal transfer gas feed pathway is formed in the spiral shape, the gas discharge suppressing member is provided with a connecting member formed therein the thermal transfer gas passageway at either or each of an inlet side and an outlet side of the thermal transfer gas, and at least a portion of the thermal transfer gas passageway is inclined with respect to the direction of the axis of said at least one electric field line.

12. The processing apparatus of claim 2, wherein a cross sectional thickness of the thermal transfer gas feed pathway is smaller than a cross sectional width of the thermal transfer gas feed pathway in a direction perpendicular to the direction of electric field.

13. The gas discharge suppressing member of claim 7, wherein the thermal transfer gas feed pathway is formed in the spiral shape, and a cross sectional thickness of the thermal transfer gas feed pathway is smaller than a cross sectional width of the thermal transfer gas feed pathway in a direction perpendicular to the axis of said at least one electric field line.

14. A processing apparatus for performing a plasma process on a surface of an object to be processed by applying a high frequency power to an electrode installed in an airtight processing chamber, comprising:
a thermal transfer gas feed pathway which supplies a thermal transfer gas, for control of a temperature of the object to be processed, to a space between the object to be processed and a holding unit installed on a lower electrode which attracts and holds the object to be processed,
wherein said thermal transfer gas feed pathway is provided through an inner portion of an insulating member disposed under the lower electrode and extends across the insulating member, and
a portion of the thermal transfer gas feed pathway inside the insulating member fonts a gas path 1) acutely inclined with respect to a direction of the axis of at least one electric field line in the insulating member during the plasma process and 2) embedded within the inner portion of the insulating member and extended along a width of the insulating member, and wherein the thermal transfer gas feed pathway is extended from an upper surface of the insulating member to a lower surface of the insulating member to extend across an entire height of the insulating member.

15. The processing apparatus of claim 1, wherein an upper portion and a lower portion of the thermal transfer gas feed pathway are in contact with the lower electrode and a grounded conductive member provided under the insulating member and an electric field is generated between the lower electrode and the conductive member by the high frequency power.

16. The processing apparatus of claim 2, wherein an upper portion and a lower portion of the thermal transfer gas feed pathway are in contact with the lower electrode and a grounded conductive member provided under the insulating member and an electric field is generated between the lower electrode and the conductive member by the high frequency power.

17. The gas discharge suppressing member of claim 7, wherein an upper portion and a lower portion of the thermal transfer gas feed pathway are in contact with the lower electrode and a grounded conductive member provided under the insulating member and an electric field is generated between the lower electrode and the conductive member by a high frequency power applied to the lower electrode.

18. The processing apparatus of claim 14, wherein an upper portion and a lower portion of the thermal transfer gas feed pathway are in contact with the lower electrode and a grounded conductive member provided under the insulating member and an electric field is generated between the lower electrode and the conductive member by the high frequency power.

19. The processing apparatus of claim 1, wherein the holding unit is an electrostatic chuck having a plurality of thermal transfer gas feed holes provided therein, and the thermal transfer gas feed pathway is connected to the thermal transfer gas feed holes such that the thermal transfer gas feed pathway supplies the thermal transfer gas to the space through the thermal transfer gas feed holes.

20. The processing apparatus of claim 2, wherein the holding unit is an electrostatic chuck having a plurality of thermal transfer gas feed holes provided therein, and the thermal transfer gas feed pathway is connected to the thermal transfer gas feed holes such that the thermal transfer gas feed pathway supplies the thermal transfer gas to the space through the thermal transfer gas feed holes.

21. The gas discharge suppressing member of claim 7, wherein the holding unit is an electrostatic chuck having a plurality of thermal transfer gas feed holes provided therein, and the thermal transfer gas feed pathway is connected to the thermal transfer gas feed holes such that the thermal transfer gas feed pathway supplies the thermal transfer gas to the space through the thermal transfer gas feed holes.

22. The processing apparatus of claim 14, wherein the holding unit is an electrostatic chuck having a plurality of thermal transfer gas feed holes provided therein, and the thermal transfer gas feed pathway is connected to the thermal transfer gas feed holes such that the thermal transfer gas feed pathway supplies the thermal transfer gas to the space through the thermal transfer gas feed holes.

* * * * *